United States Patent
Pole, II et al.

(10) Patent No.: US 6,311,281 B1
(45) Date of Patent: Oct. 30, 2001

(54) APPARATUS AND METHOD FOR CHANGING PROCESSOR CLOCK RATIO SETTINGS

(75) Inventors: Edwin J. Pole, II, Hillsboro, OR (US); John T. Orton, Los Altos; Cau L. Nguyen, Fremont, both of CA (US); Gurbir Singh, Portland, OR (US); Xia Dai, Fremont, CA (US); Ravi Nagaraj, Lakeville, MN (US)

(73) Assignee: Edwin H. Taylor

( * ) Notice: Subject to any disclaimer, the term of this patent is extended or adjusted under 35 U.S.C. 154(b) by 0 days.

(21) Appl. No.: 09/261,058

(22) Filed: Mar. 2, 1999

(51) Int. Cl.⁷ ........................................... G06F 1/04
(52) U.S. Cl. ........................... 713/322; 713/501
(58) Field of Search ..................... 713/322, 323, 713/501

(56) References Cited

U.S. PATENT DOCUMENTS

| | | | |
|---|---|---|---|
| 5,268,654 | * 12/1993 | Furutani et al. ................... | 331/10 |
| 5,369,771 | * 11/1994 | Gettel .................................. | 713/322 |
| 5,473,767 | * 12/1995 | Kardach et al. .................... | 7013/600 |
| 5,511,181 | * 4/1996 | Baxter ............................... | 713/501 X |
| 6,076,171 | * 6/2000 | Kawata .............................. | 713/501 |
| 6,085,330 | * 7/2000 | Hewitt et al. ...................... | 713/322 |
| 6,163,583 | * 12/2000 | Lin et al. ........................... | 713/600 X |

* cited by examiner

*Primary Examiner*—Thomas M. Heckler
(74) *Attorney, Agent, or Firm*—Blakely, Sokoloff, Taylor & Zafman LLP

(57) ABSTRACT

A processor has an external pin that can be asserted to lock in new clock ratio information dynamically. A state machine of the processor defines a stop grant state that is utilized to halt the internal clocking signal of the processor. A storage location, such as a register, is utilized to load new clock frequency information into the clock generator circuit of the processor. De-asserting the external pin of the processor causes the processor to resume normal operations, but at the newly set clock frequency.

20 Claims, 2 Drawing Sheets

APPARATUS AND METHOD FOR CHANGING PROCESSOR CLOCK RATIO SETTINGS

FIELD OF THE INVENTION

The present invention relates to the field of computers and computer systems. In particular, the invention relates to apparatus and methods incorporated within a processor for controlling clock cycles.

BACKGROUND OF THE INVENTION

With the advent of mobile computing, a demand was created for circuits and methods that provide greater control over clocking signals. This demand arose because of the strong correlation between the clock signal frequency at which the microprocessor operates, and the total power dissipation of the system. In other words, in a mobile computer environment it is desirable to have the capability of slowing down the operating clock frequency of the processor during times of relative inactivity or non-use. Doing so reduces the power drain on the computer's battery. When normal operating activity resumes, the clocking frequency should then be increased to provide for maximum system performance.

In the past, various power management schemes have been designed for use in microprocessor-controlled computer systems. By way of example, the popular Pentium® and Pentium II® processors define a power management state in which the processor's internal clock signal is stopped or halted. This state is initiated by assertion of an external input pin, known as the STPCLK# input. When the STPCLK# is asserted, the processor initiates a sequence of events that results in halting the internal clock signal. This mechanism is described in detail in U.S. Pat. No. 5,473,767, which patent is assigned to the assignee of the present application.

FIG. 1 is a state diagram illustrating the operation of the prior art mechanism for controlling the internal clock signal of the processor. The sequence of events shown in FIG. 1 begins with the assertion of the STPCLK# signal at a pin of the processor as shown by ellipse 10. When the STPCLK# signal pin is asserted, a microflag in the microcode engine of the processor gets set; it also signals an internal state machine in a dedicated STP_CLK logic block. An interrupt prioritizer insures that the microcode engine recognizes this as an interrupt to be asserted at the next instruction boundary. In this manner, the internal clock signal of the processor is not halted until after the end of the current instruction. This is represented in FIG. 5 by decision block 11.

Next, all of the bus cycles within the processor's internal bus unit (BU) are flushed and then idled. This is shown in FIG. 1 by block 12, which indicates that the bus unit of the processor is emptied of bus cycles. At this point, the microcode indicates to the BU to execute a STOP_CLK acknowledgement bus cycle. This is shown in FIG. 1 by block 13. Finally, the internal pipelines of the processor are emptied, as represented in block 14.

After that, the pipelines have been emptied, microcode indicates to the STP_CLK logic block to stop the internal clock. This is accomplished by asserting a STP_MY_CLK signal. This signal basically masks the internal clock signal of the processor through an AND gate function.

When the STPCLK# pin is de-asserted, the STP_CLK logic block automatically restarts the internal clock by deactivating the STP_MY_CLK signal. It should be understood that during the time that the internal clock signal is halted, the phase lock loop circuit that produces the internal clock signal typically remains active. After the STPCLK# has been de-asserted, the microcode engine of the processor detects that the internal clock signal is once again active (block 16), and generates a RETURN (block 17).

The prior art Pentium® processors also include a feature for changing the operating clock frequency provided to the internal logic. However, this can only be accomplished by resetting the processor. When the processor is RESET the state of four pins on the front side of the processor bus are used to latch in a new clock frequency ratio. These four pins are labeled A20M#, IGNEE#, NMI, and INTR. It should be understood that when the Pentium® processor is in the RESET state, the clocking circuitry is stopped.

To provide more advanced processor clock signal control, it is desirable to change the internal clock frequency of the processor dynamically. In other words, there is an unsatisfied need for a processor capable of changing its internal clock frequency "on-the-fly"—obviating the need to reset the processor.

As will be seen, the present invention provides an apparatus and method for dynamically changing the clock frequency of a processor. This invention is advantageously suited for use in the mobile computing market, where it is desirable to quickly change the processor from one performance level to another. For example, the present invention permits the processor to operate in a high-power, high-performance state when docked in a fixture capable of supplying large amounts of power and external cooling. Alternatively, when the system is operating solely on battery power, such as would be the case in a mobile or laptop computer, the processor could enter a lower performance state which requires less power and cooling.

SUMMARY OF THE INVENTION

An apparatus and method is provided for quickly changing the processor of clock ratio settings, which facilitates the use of higher performance processors in mobile computing systems.

In one embodiment, the processor of the present invention comprises an external pin that may be asserted to lock in new clock ratio information dynamically. A state machine of the processor defines a Stop Grant state, with an internal clock signal of the processor being halted in the Stop Grant state. A storage location such as a register is utilized to load new clock frequency information into the clock generator circuit of the processor. De-asserting the external pin of the processor results in the processor resuming a normal operating state at the newly set internal clock frequency.

DESCRIPTION OF THE DRAWINGS

The present invention will be understood more fully from the detailed which follows and from the accompanying drawings, which however, should not be taken to limit the invention to the specific embodiments shown, but are for explanation and understanding only

DETAILED DESCRIPTION

An apparatus and method for dynamically changing clock frequency settings of a processor is described. In the following description numerous specific details are set forth, such as specific operating states, signals, logic circuits, etc., in order to provide a thorough understanding of the present invention. It will be obvious, however, to one skilled in the art, that these specific details may not be needed to practice the present invention.

Figure 1:
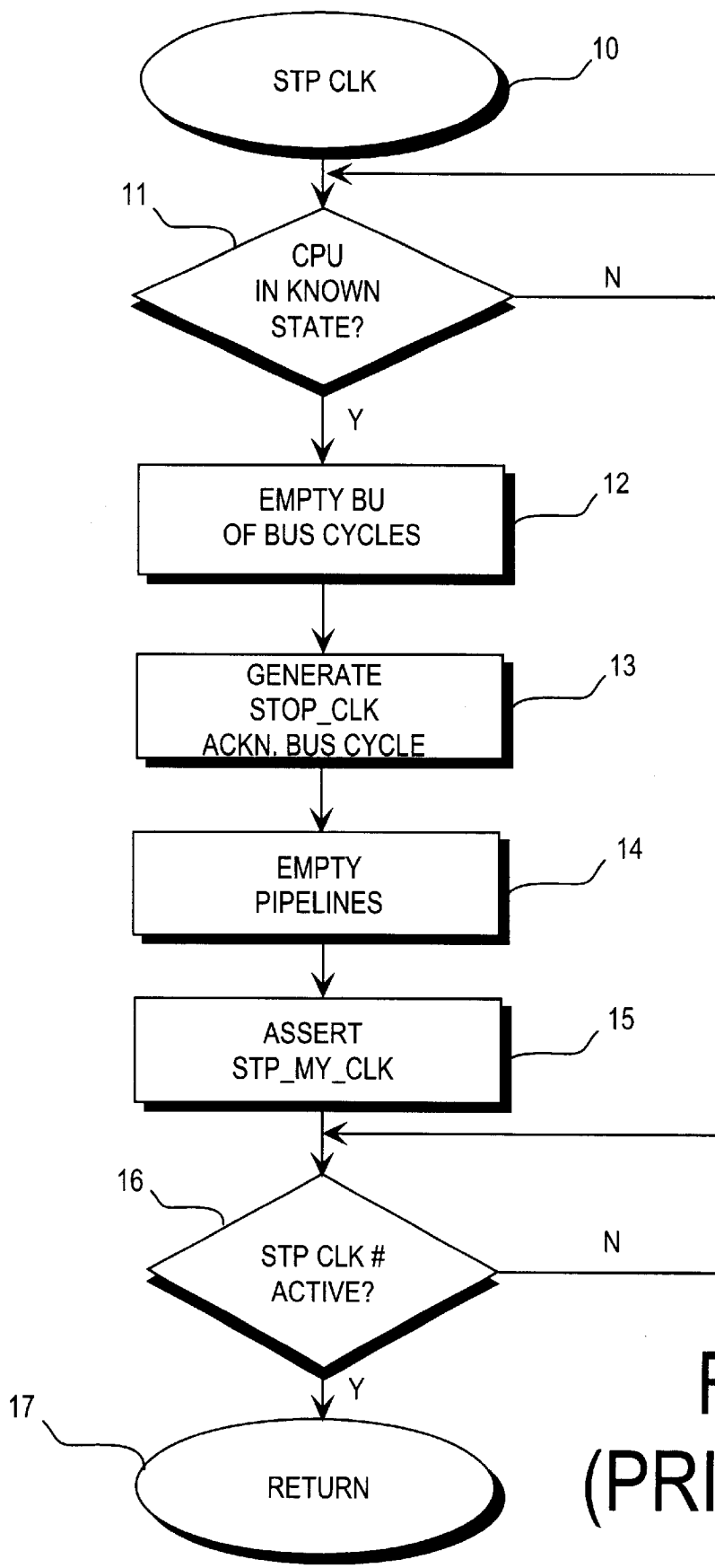
FIG. 1 illustrates a prior art method of stopping the internal clock signal of a processor.
Figure 2:
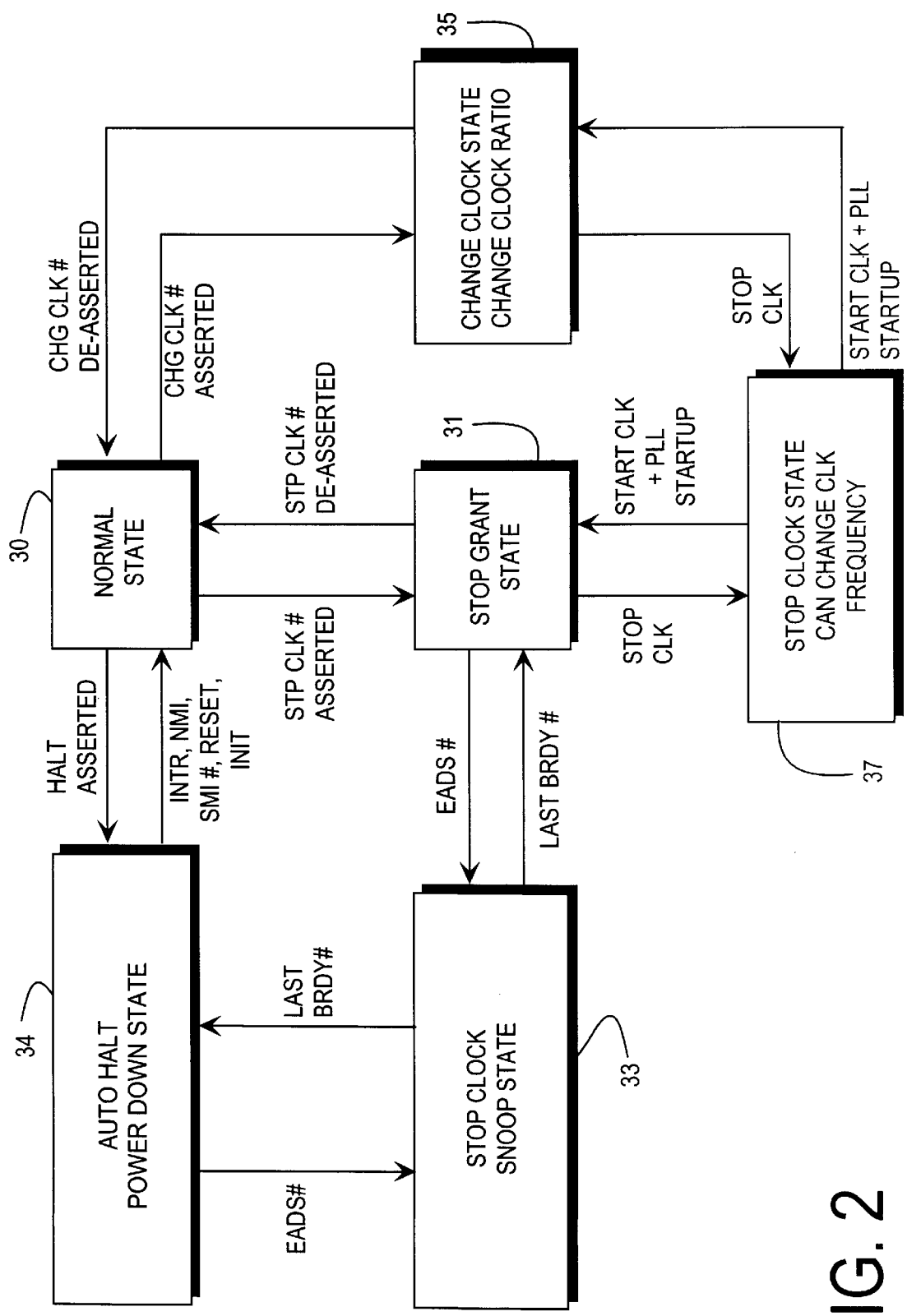
FIG. 2 is a block diagram of the state machine implemented in one embodiment of the present invention.

FIG. 2 is a state diagram representing the various operating states of the microprocessor according to one embodiment of the present invention. Included in FIG. 2 is a Normal Operating State 30, an Auto Halt Power-Down State 34, a Stop Clock Snoop State 33, a Stop Grant State 31, and a Stop Clock State 37. While the processor is in Stop Clock State 37, the operating clock (i.e., CLK) frequency can be changed. The state diagram of FIG. 2 also includes a Change Clock State 35, which is utilized in accordance with the present invention to change clock ratio information of the processor.

Normal Operating State 30 represents the typical operational state of the processor. It is in this state that the processor performs usual tasks such as executing programs of instructions, performing calculations, processing data, etc. From Normal Operating State 30 the processor transitions to Stop Grant State 31 upon assertion of the STPCLK# signal pin. The STPCLK# signal represented in FIG. 2 is the same as that discussed previously in connection with the prior art Pentium® processor. De-asserting the STPCLK# signal while in Stop Grant State 31 returns the processor to Normal Operating State 30.

Stop Grant State 31 halts the clock signal provided to the internal logic of the processor. Entering Stop Grant State 31 also causes the bus unit of the processor to empty all of its pending bus cycles, as well as flush the internal pipelines of the processor. Additionally, a STOP GRANT bus cycle is issued, with the system returning a BRDY# signal.

The processor transitions to the Auto Halt Power-Down State 34 from the Normal Operating State 30 upon assertion of the HALT instruction. The processor returns to Normal Operating State 30 from Auto Halt Power-Down State 34 upon receiving any one of a number of interrupt or reset signals. For example, commonly known signals such as INTR, NMI, SMI#, RESET, or INIT cause the processor to transition back to Normal Operating State 30 from Auto Halt Power-Down State 34.

A Stop Clock Snoop State 33 can be entered from either Auto Halt Power-Down State 34 or Stop Grant state 31 upon issuance of an EADS# signal. The Stop Clock Snoop State 33 is a power-down sleep state of the processor; however, it is one in which the processor still snoops the system bus for certain activity.

When the processor is in Stop Grant State 31 and the external clock input signal of the processor is stopped the processor transitions to the Stop Clock State 37. Practitioners in the art will appreciate that the external clock signal provided to the processor is utilized to drive the processor's clock generator circuitry. Most often this clock generator circuitry comprises a conventional phase-locked loop (PLL) circuit. As an alternative to a PLL, a delay line loop or other functionally equivalent circuit may be utilized to generate the internal clock signal of the processor.

While the processor is in Stop Clock State 37, the external clock frequency applied to the processor may be changed. Upon start-up of the external clock signal, the PLL of the processor responds by producing the internal clock signal, and the processor is returned to Stop Grant State 31.

Also shown in the state diagram of FIG. 2 is the Change Clock State 35. Change Clock State 35 is similar to Stop Grant State 31, except that upon exiting Change Clock State 35, the processor locks in new clock ratio information. The new clock information can be provided from a variety of sources: a programmable register, a memory, a set of processor input pins, through the execution of a specialized instruction, or any other conventional method. Note that Change Clock State 35 can be entered from Normal Operating State 30 upon assertion of the CHGCLK# signal. This signal, in one embodiment, may be applied through a new input pin of the processor.

De-asserting the CHGCLK# signal while in Change Clock State 35 returns the processor to Normal Operating State 30. When CHGCLK# is de-asserted, the processor performs a sequence of operations to ensure that program execution commences at the beginning of the next instruction. This sequence is similar to that previously described.

In addition, it should be noted that Stop Clock State 37 could also be entered from the Change Clock State 35. Once stopped, the frequency of the external clock signal and the PLL ratio may be altered to further enhance the number of performance level choices in the computer system. In the case where the clock generator circuitry comprises a PLL, the PLL settles on the new internal clock frequency.

In an exemplary embodiment, fast and slow clock ratios may be selected by using programmable fuses inside the processor. In such an implementation, the external CHGCLK# pin becomes a high/low input signal to define which fuse blocks to utilize when setting a new clock frequency.

Furthermore, the processor's supply voltage may also be altered to optimize system performance when in Stop Clock State 37. This feature allows the system to operate at a number of discrete performance levels, which is particularly advantageous in mobile computing applications.

We claim:

1. An apparatus for changing a clock frequency generated by a clocking circuit of a processor comprising:

at least one pin of the processor;

a state machine that defines a normal operating state of the processor and a change clock state, the processor transitioning from the normal operating state to the change clock state whenever a signal is asserted at the at least one pin, and from the change clock state to the normal operating state upon de-assertion of the signal; and means for entering new clock frequency information to the clocking circuit when the processor is in the change clock state.

2. The apparatus of claim 1 wherein the means comprises a register coupled to the clocking circuit.

3. The apparatus of claim 1 wherein the means comprises one or more additional pins coupled to the clocking circuit.

4. The apparatus of claim 1 wherein the means comprises an instruction for execution by the processor.

5. The apparatus of claim 1 wherein the means comprises a memory storage location coupled to the clocking circuit.

6. The apparatus of claim 1 wherein the state machine further defines a stop clock state wherein an external clock signal is stopped, the external signal being provided to the clocking circuit.

7. The apparatus of claim 1 wherein the clocking circuit comprises a phase-locked loop circuit.

8. The apparatus of claim 1 wherein the clocking circuit comprises a delay line loop circuit.

9. The apparatus of claim 6 wherein the state machine further defines a stop grant state that is entered prior to the stop clock state of the processor, the processor halting an internal clock signal provided by the clocking circuit when in the stop grant state.

10. A method of changing a clock frequency of a processor comprising the steps of:

(a) asserting a first signal while the processor is operating in a normal state, the first signal causing the processor to first enter a change clock state or a stop clock state;

(b) locking a new clock ratio into a clock generator circuit of the processor while in either the change clock state or the stop clock state;

(c) de-asserting the first signal causing the processor to transition from the change clock state to the normal state, wherein the clock frequency of the processor in the normal state is set by the new clock ratio.

11. The method of claim 10 wherein the first signal is provided at one or more pins of the processor.

12. The method according to claim 10 wherein the clock generator circuit comprises a phase-locked loop circuit.

13. The method according to claim 10 wherein step (b) comprises the step of accessing a register that contains the new clock ratio; and loading the new clock ratio from the register into the clock generator circuit.

14. The method according to claim 10 wherein step (b) comprises the step of providing a signal from one or more input pins of the processor.

15. A method of changing a clock frequency of a processor comprising the steps of:

(a) asserting a stop clock signal while the processor is operating in a normal state, the stop clock signal causing the processor to enter a stop grant state, an internal clock signal of the processor being halted in the stop grant state;

(b) halting a clock generator circuit of the processor by de-asserting an external signal coupled to the clock generator circuit, the clock generator circuit producing the internal clock signal of the processor;

(c) locking new clock ratio information into the clock generator circuit;

(d) starting the clock generator circuit by asserting the external signal; and (e) de-asserting the stop clock signal.

16. The method of claim 15 wherein the stop clock signal is provided at a pin of the processor.

17. The method of claim 15 wherein the processor operates to empty an internal pipeline while in the stop grant state.

18. The method of claim 15 wherein step (c) comprises the step of asserting a change signal at an additional pin of the processor.

19. The method according to claim 15 wherein step (c) comprises the step of loading a bit value stored in a register of the processor into the clock generator circuit.

20. A processor comprising:

a pin;

a state machine that defines a normal operating state of the processor and a change clock state, the processor transitioning from the normal operating state to the change clock state whenever the pin is asserted, and from the change clock state to the normal operating state upon de-assertion of the pin; and a storage location that contains new clock frequency information provided to a clocking circuit when the processor is in the change clock state.

\* \* \* \* \*

UNITED STATES PATENT AND TRADEMARK OFFICE
CERTIFICATE OF CORRECTION

PATENT NO. : 6,311,281 B1
DATED : October 30, 2001
INVENTOR(S) : Pole, II et al.

It is certified that error appears in the above-identified patent and that said Letters Patent is hereby corrected as shown below:

Column 4,
Line 4, delete "registor" and insert -- register --.

Signed and Sealed this

Sixteenth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,311,281 B1
APPLICATION NO. : 09/261058
DATED : October 30, 2001
INVENTOR(S) : Pole, II et al.

Page 1 of 1

It is certified that error appears in the above-identified patent and that said Letters Patent is hereby corrected as shown below:

Title Page;
In (73), in the "Assignee", delete "Edwin H. Taylor" and replace with --Intel Corporation, Santa Clara, Calif.--.

Signed and Sealed this

First Day of December, 2009

David J. Kappos
*Director of the United States Patent and Trademark Office*